(12) United States Patent
Kitazawa

(10) Patent No.: US 11,757,380 B2
(45) Date of Patent: Sep. 12, 2023

(54) DRIVING DEVICE INCLUDING MOVABLE PART, BASE MEMBER, DRIVING SECTION CONFIGURED TO DRIVE THE MOVABLE PART, AND PEDESTAL TO WHICH THE BASE MEMBER IS FIXED

(71) Applicant: PIONEER CORPORATION, Tokyo (JP)

(72) Inventor: Shogo Kitazawa, Tokyo (JP)

(73) Assignee: PIONEER CORPORATION, Tokyo (JP)

( * ) Notice: Subject to any disclaimer, the term of this patent is extended or adjusted under 35 U.S.C. 154(b) by 272 days.

(21) Appl. No.: 17/272,274

(22) PCT Filed: Nov. 14, 2019

(86) PCT No.: PCT/JP2019/044655
§ 371 (c)(1),
(2) Date: Feb. 26, 2021

(87) PCT Pub. No.: WO2020/110747
PCT Pub. Date: Jun. 4, 2020

(65) Prior Publication Data
US 2021/0257934 A1    Aug. 19, 2021

(30) Foreign Application Priority Data

Nov. 30, 2018  (JP) ................. 2018-225146

(51) Int. Cl.
*H02N 2/00* (2006.01)
*H02K 5/22* (2006.01)
(Continued)

(52) U.S. Cl.
CPC ............. *H02N 2/006* (2013.01); *H02K 5/22* (2013.01); *H02K 41/0356* (2013.01);
(Continued)

(58) Field of Classification Search
CPC .......... H02N 2/006; H02N 2/028; H02K 5/22; H02K 41/0356; H02K 2201/18;
(Continued)

(56) References Cited

U.S. PATENT DOCUMENTS 7,868,490 B2    1/2011  Nagai et al.
8,456,727 B2 *  6/2013  Yasuda .............. G02B 26/0858
                                                          359/224.1
(Continued)

FOREIGN PATENT DOCUMENTS

JP   2013246362 A   12/2013
WO   2014103803 A1   7/2014

OTHER PUBLICATIONS

International Search Report for related JP App. No PCT/JP2019/044655 dated Feb. 4, 2020 English translation provided; 9 pages.
(Continued)

*Primary Examiner* — Emily P Pham
(74) *Attorney, Agent, or Firm* — Procopio, Cory, Hargreaves & Savitch LLP

(57) ABSTRACT

A driving device that can be prevented from being damaged is provided. A base member includes a frame-shaped part that rotatably supports a movable part via a shaft part provided on an inner circumference side of the frame-shaped part, and an elastic structural part extending to an outer circumference side of the frame-shaped part. The elastic structural part of the base member is joined to the pedestal, and this allows the difference in amount of thermal deformation generated on the base member and the pedestal to be absorbed by deformation of the elastic structural part, thereby preventing the driving device from being damaged.

6 Claims, 4 Drawing Sheets

(51) Int. Cl.
*H02K 41/035* (2006.01)
*H02N 2/02* (2006.01)
*G01S 7/481* (2006.01)
*G02B 26/08* (2006.01)

(52) U.S. Cl.
CPC .............. *H02N 2/028* (2013.01); *G01S 7/481* (2013.01); *G02B 26/0816* (2013.01); *H02K 2201/18* (2013.01)

(58) Field of Classification Search
CPC .............. G02B 26/0816; G02B 26/085; G02B 26/0858; G02B 26/101; G01S 7/481; B81B 3/00
See application file for complete search history.

(56) References Cited

U.S. PATENT DOCUMENTS

| | | |
|---|---|---|
| 9,467,034 B2 | 10/2016 | Gamet |
| 10,103,613 B2 * | 10/2018 | Sadaharu ........... G02B 26/0841 |
| 10,539,780 B2 * | 1/2020 | Lemaire ............... G02B 26/085 |
| 2008/0143196 A1 | 6/2008 | Sprague et al. |
| 2013/0128328 A1 * | 5/2013 | Honda .................. G02B 26/10 359/199.4 |
| 2015/0234177 A1 | 8/2015 | Ishikawa et al. |
| 2017/0052363 A1 | 2/2017 | Straub et al. |

OTHER PUBLICATIONS

European Patent Office, Extended European Search Report, Application No. 19891330.3, dated Aug. 12, 2022, in 10 pages.

* cited by examiner

DRIVING DEVICE INCLUDING MOVABLE PART, BASE MEMBER, DRIVING SECTION CONFIGURED TO DRIVE THE MOVABLE PART, AND PEDESTAL TO WHICH THE BASE MEMBER IS FIXED

CROSS-REFERENCE TO RELATED APPLICATIONS

This application is a U.S. National Stage entry of PCT Application No. PCT/JP2019/044655, filed on Nov. 14, 2019, which claims priority to JP Application No. 2018-225146, filed Nov. 30, 2018. The contents of the foregoing are incorporated by reference.

TECHNICAL FIELD

The present invention relates to a driving device.

BACKGROUND ART

Conventionally, there has been proposed a magnetic force type driving device configured to rotate a movable plate by rotatably supporting the movable plate with respect to a frame with a pair of beams and by providing a yoke in the vicinity of a permanent magnet (refer for example to Patent Document 1). In the magnetic force type driving device described in Patent Document 1, a current is applied to a coil wound around the yoke so as to generate magnetic poles different from each other on a pair of ends of the yoke to increase a swing angle of a movable part.

CITATION LIST

Patent Document

Patent Document 1: JP 2013-246362 A

SUMMARY OF THE INVENTION

Problem to be Solved

In the driving device described in Patent Document 1, the frame is disposed on the yoke. That is, in order to rotate the movable plate in a stable manner, it is necessary to fix the frame (base member) to some kind of pedestal. However, while the base member is often made of the same material as the movable part, the pedestal may be made of a different material than the base member, and these materials may have different coefficients of thermal expansion.

In this case, when heat is applied to the driving device, a joined portion between the pedestal and the base member could be subjected to a large stress due to the difference in amount of thermal deformation between the pedestal and the base member, possibly causing damage thereto. It is thus conceivable to absorb the difference in amount of thermal deformation by increasing the amount of adhesive used for the joined portion; however, an increase in the amount of adhesive would increase the effect of curing shrinkage during the adhesion, causing stress on the joined portion between the pedestal and the base member or on the base member itself.

Therefore, an example of the problem to be solved by the present invention is to provide a driving device that can be prevented from being damaged.

Solution to Problem

In order to solve the problem and to achieve the object described above, a driving device of the present invention according to a first aspect includes a movable part, a base member that includes a frame-shaped part and that rotatably supports the movable part via a shaft part provided on an inner circumference side of the frame-shaped part, a driving section configured to drive the movable part, and a pedestal to which the base member is fixed, wherein the base member includes an elastic structural part extending on an outer circumference side of the frame-shaped part, and the elastic structural part is joined to the pedestal.

DESCRIPTION OF EMBODIMENTS

Figure 1:
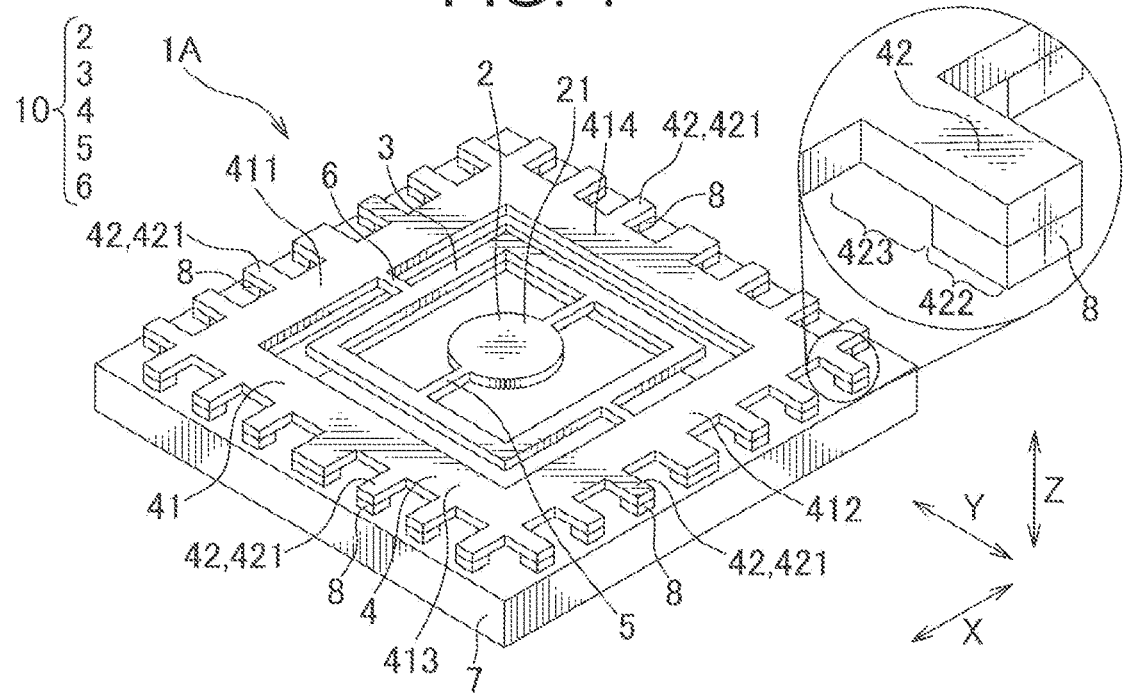
FIG. 1 is a perspective view showing a driving device according to a first example of the present invention.

An embodiment of the present invention will be described below. A driving device according to an embodiment of the present invention includes a movable part, a base member that includes a frame-shaped part and that rotatably supports the movable part via a shaft part provided on an inner circumference side of the frame-shaped part, a driving section configured to drive the movable part, and a pedestal to which the base member is fixed. The base member includes an elastic structural part extending on an outer circumference side of the frame-shaped part, and the elastic structural part is joined to the pedestal.

The elastic structural part of the base member is joined to the pedestal, thus the difference in amount of thermal deformation generated on the base member and the pedestal can be absorbed by the deformation of the elastic structural part, thereby preventing damage to the base member and to the connecting part between the base member and the pedestal. In this instance, the elastic structural part is a part having a shape that is more easily elastically deformable compared to the frame-shaped part.

It is preferable that the elastic structural part includes an orthogonal part that extends so as to be orthogonal to the frame-shaped part. This allows to form the orthogonal part so as to protrude outward from the frame-shaped part, thereby facilitating the formation of the elastic structural part.

The elastic structural part may include a parallel part extending along the frame-shaped part. This can prevent an increase in the size of the base member even when the size of the parallel part is increased along the frame-shaped part, thereby facilitating the absorption of the difference in amount of thermal deformation.

The frame-shaped part is not joined to the pedestal. Alternatively, only a part of the frame-shaped part may be joined to the pedestal. That is, a joined region on the base member may be configured such that there is an appropriate balance between the deformability of the elastic structural part and the joining strength between the base member and the pedestal.

It is preferable that joining members that join the elastic structural parts to the pedestal are disposed at a plurality of positions so as to correspond to each of the plurality of elastic structural parts. This can reduce the amount of the joining members used.

It is preferable that the elastic structural part includes a non-joined part that is continuous with the frame-shaped part and that is not joined to the pedestal, and a joined part that is continuous with the non-joined part and that is joined to the pedestal. This can facilitate the elastic deformation of the non-joined part, thereby reducing the stress that is applied on the frame-shaped part and on the joined part due to the difference in amount of thermal deformation generated on the base member and the pedestal.

EXAMPLES

Each example of the present invention will be described in detail below. With respect to a second example, the same components and the components having the same function as those described in a first example are designated by the same reference signs as those in the first example, and the description thereof is omitted.

First Example

Figure 2:
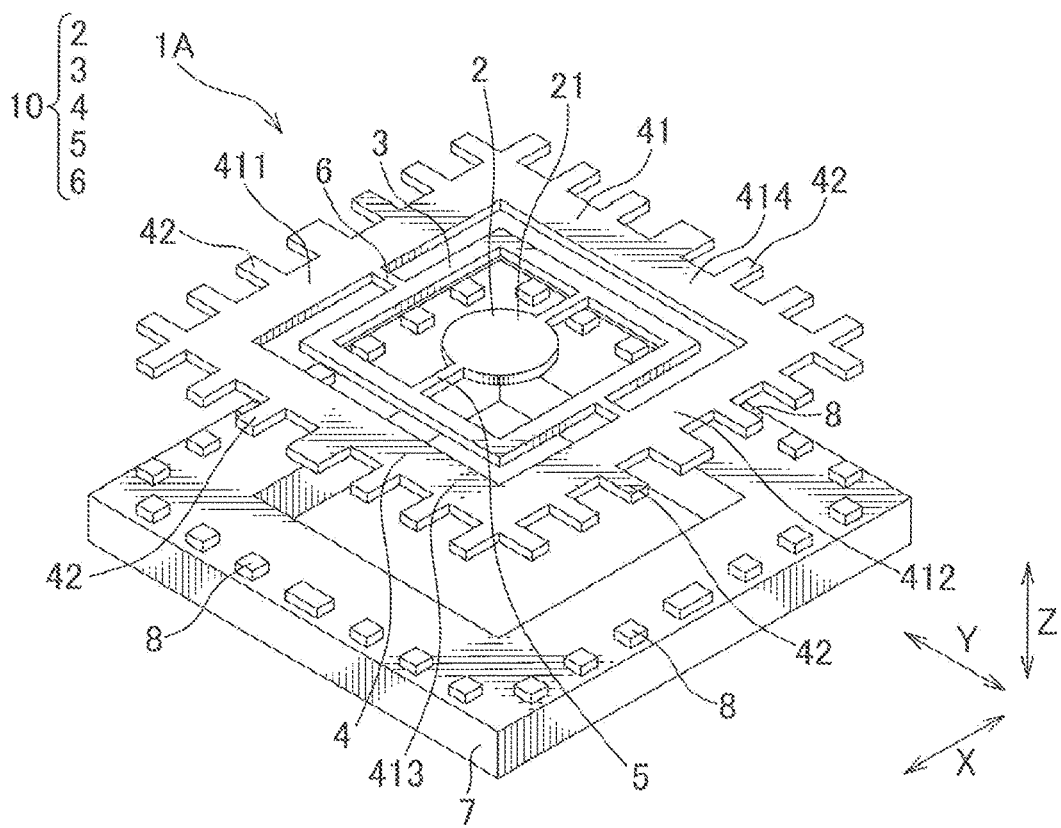
FIG. 2 is an exploded perspective view showing the driving device.
Figure 3:
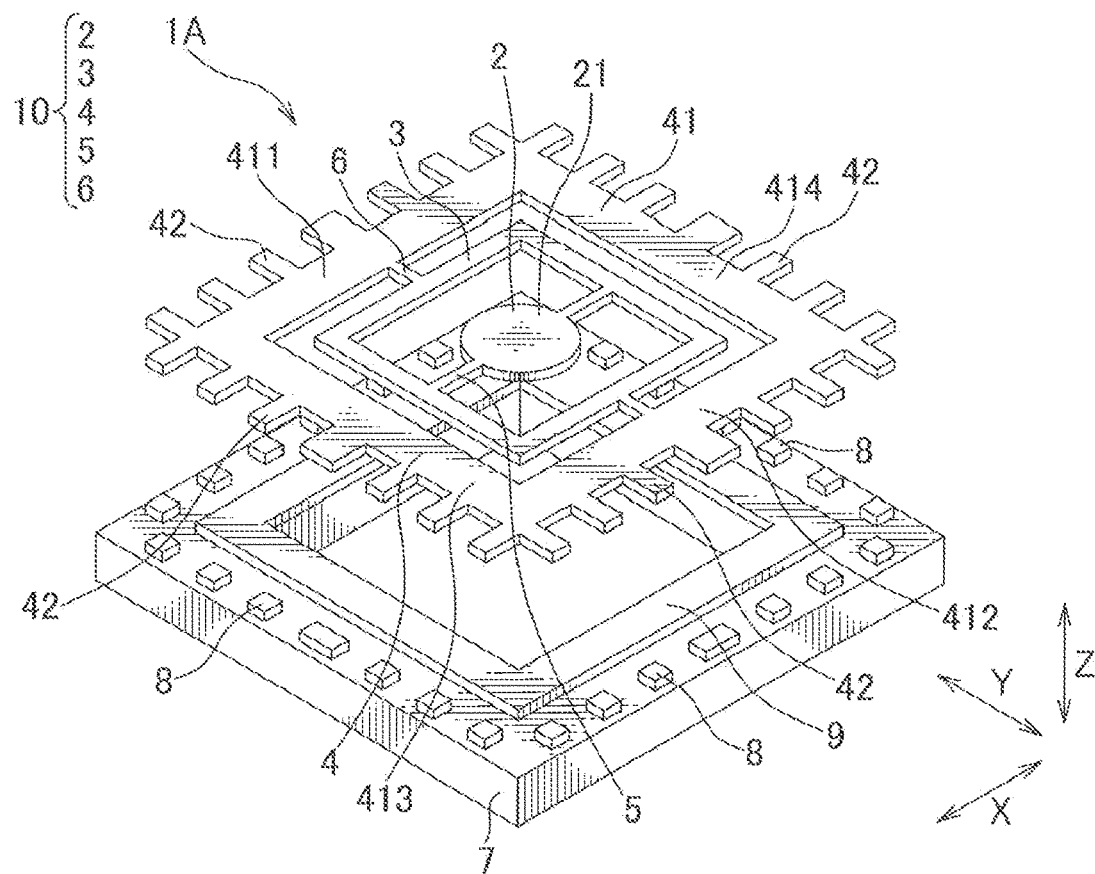
FIG. 3 is an exploded perspective view showing the driving device provided with a support member.
Figure 4:
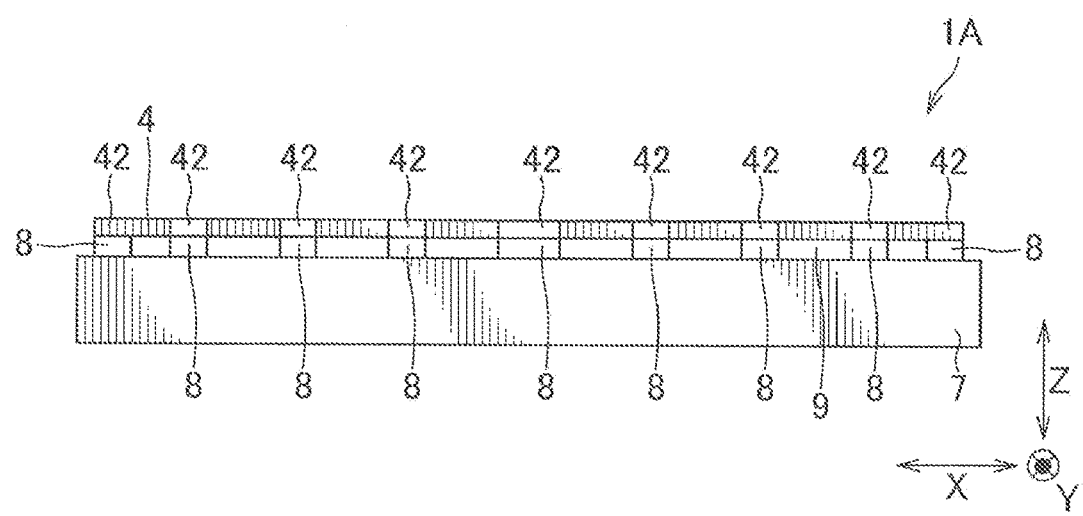
FIG. 4 is a side view showing the driving device.

As shown in FIGS. 1 to 4, a driving device 1A of this example is an optical deflector including a mirror 2, an intermediate frame 3, a base member 4, an inner torsion bar 5, an outer torsion bar 6, a pedestal 7 and a driving section. The driving device 1A is used, for example, for a detection device that is mounted on a vehicle to detect a distance from another vehicle, an installation or the like by transmitting and receiving light such as infrared rays.

In this example, the inner torsion bar 5 and the outer torsion bar 6 extend so as to be substantially orthogonal to each other, wherein an extending direction (axis direction) of the inner torsion bar 5 corresponds to an X direction, an extending direction (axis direction) of the outer torsion bar 6 corresponds to a Y direction, and a direction substantially orthogonal to the XY plane corresponds to a Z direction.

The mirror 2 is formed in a plate shape extending along the XY plane, and a surface 21 thereof is a reflective face formed by mirror finishing. A pair of inner torsion bars 5 is connected to an outer circumference side of the mirror 2. Although the mirror 2 has a circular plate shape in the illustrated example, the mirror 2 may have an elliptical plate shape or a polygonal plate shape such as a rectangle plate shape, depending on the application.

The intermediate frame 3 is formed in a rectangular frame shape extending along the XY plane and is arranged so as to surround the mirror 2. A pair of inner torsion bars 5 is connected to an inner circumference side of the intermediate frame 3, and a pair of outer torsion bars 6 is connected to an outer circumference side of the intermediate frame 3. That is, the mirror 2 is rotatably supported by the intermediate frame 3 via the inner torsion bars 5.

The base member 4 includes a rectangular frame-shaped part 41 extending along the XY plane and surrounding the intermediate frame 3, and a plurality of elastic structural parts 42 extending on the outer circumference side of the frame-shaped part 41. A pair of outer torsion bars 6 is connected to an inner circumference side of the base member 4. That is, assuming the mirror 2, the intermediate frame 3 and the inner torsion bars 5 constitute a movable part, the movable part is rotatably supported by the base member 4 via the outer torsion bars 6 as a shaft part.

The frame-shaped part 41 is constituted of a first side part 411 and a second side part 412 extending along the X direction, and a third side part 413 and a fourth side part 414 extending along the Y direction. The plurality of elastic structural parts 42 is continuous with the first side part 411 or the second side part 412 and extends in the Y direction, and is continuous with the third side part 413 or the fourth side part 414 and extends in the X direction, respectively. That is, the entire elastic structural part 42 is an orthogonal part 421 that extends so as to be orthogonal to the frame-shaped part 41. Since the entire elastic structural part 42 is arrange to be the orthogonal part 421, the elastic structural part 42 is more easily elastically deformable compared to the frame-shaped part 41.

The mirror 2, the intermediate frame 3, the base member 4, the inner torsion bars 5 and the outer torsion bars 6 are integrally formed on a substrate made of Si, for example, thereby constituting a mirror unit 10.

The pedestal 7 is made of a material such as an aluminum alloy or a resin and has a higher rigidity than the base member 4, and its coefficient of thermal expansion may be different from that of the base member 4. The pedestal 7 is formed in a rectangular frame shape extending along the XY plane. In this example, it is assumed that an opening on an inner side of the frame-shaped part 41 and an opening on an inner side of the pedestal 7 substantially coincide with each other. The pedestal 7 has an appropriate shape according to, for example, the shape of the base member 4 or the shape of an object to which the driving device 1A is mounted.

The driving section is configured to drive (rotate) the mirror 2 and the intermediate frame 3. A driving method of the driving section is not limited, and the driving section may be constituted of a coil and a magnetic element, or may be constituted of a piezoelectric element, for example.

Now, details of a joining structure for joining the base member 4 with respect to the pedestal 7 will be described. The pedestal 7 is provided with joining members 8 disposed at a plurality of positions corresponding to the respective distal end parts 422 of the elastic structural parts 42. By curing these joining members 8, the elastic structural parts 42 are joined to the pedestal 7. The joining member 8 is preferably an acrylic adhesive, an epoxy adhesive, a resist for a permanent film or the like that has elasticity even after curing, but it is not limited thereto.

In this instance, the distal end part 422 of the elastic structural part 42 corresponding to the joining member 8 is a joined part to be joined to the pedestal 7, and the proximal end part 423 of the elastic structural part 42 corresponding to the position where the joining member 8 is not provided is a non-joined part that is not joined to the pedestal 7. In this instance, the proximal end part 423 is continuous with the frame-shaped part 41, and the distal end part 422 is continuous with the proximal end part 423. In addition, the frame-shaped part 41 is not joined to the pedestal 7 (i.e., the frame-shaped part 41 does not include the joined part).

When fixing the base member 4 with respect to the pedestal 7 as described above, it is preferable to provide a support member 9 for positioning the base member 4 and the pedestal 7 in the Z direction. The support member 9 is formed in a frame shape so as to correspond to the frame-shaped part 41 and is disposed on an inner side with respect to the joining members 8. The shape of the support member 9 is not limited to the frame shape, as long as at least a part of the support member 9 is arranged to abut on the frame-shaped part 41. This can prevent the base member 4 from being excessively approached to or tilted with respect to the pedestal 7 before the joining members 8 are cured.

According to the above-described configuration, the elastic structural parts 42 of the base member 4 are joined to the pedestal 7, thus the difference in amount of thermal deformation generated on the base member 4 and the pedestal 7 can be absorbed by the deformation of the elastic structural parts 42, thereby preventing damage to the base member 4 and to the joined part between the base member 4 and the pedestal 7.

Further, since the entire elastic structural part 42 is the orthogonal part 421, and the orthogonal part 421 can be formed so as to protrude outward from the frame-shaped part 41, thus this can facilitate the formation of the elastic structural parts 42.

Further, the joining members 8 for joining the elastic structural parts 42 to the pedestal 7 are disposed at the plurality of positions so as to correspond to each of the plurality of elastic structural parts 42, thereby reducing the amount of the joining members 8 used.

Since the elastic structural part 42 includes the distal end part 422 as the joined part and the proximal end part 423 as the non-joined part, the proximal end part 423 is easily elastically deformable, thereby reducing the stress applied on the frame-shaped part 41 and on the joined part due to the difference in amount of thermal deformation generated on the base member 4 and the pedestal 7.

Second Example

Figure 5:
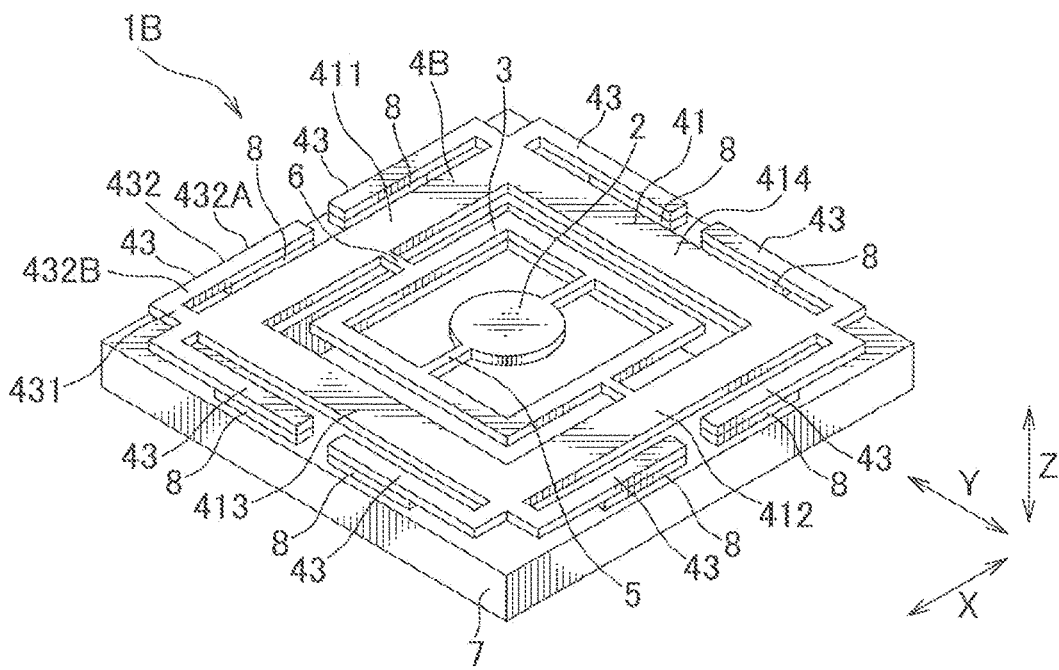
FIG. 5 is a perspective view showing a driving device according to a second example of the present invention.
Figure 6:
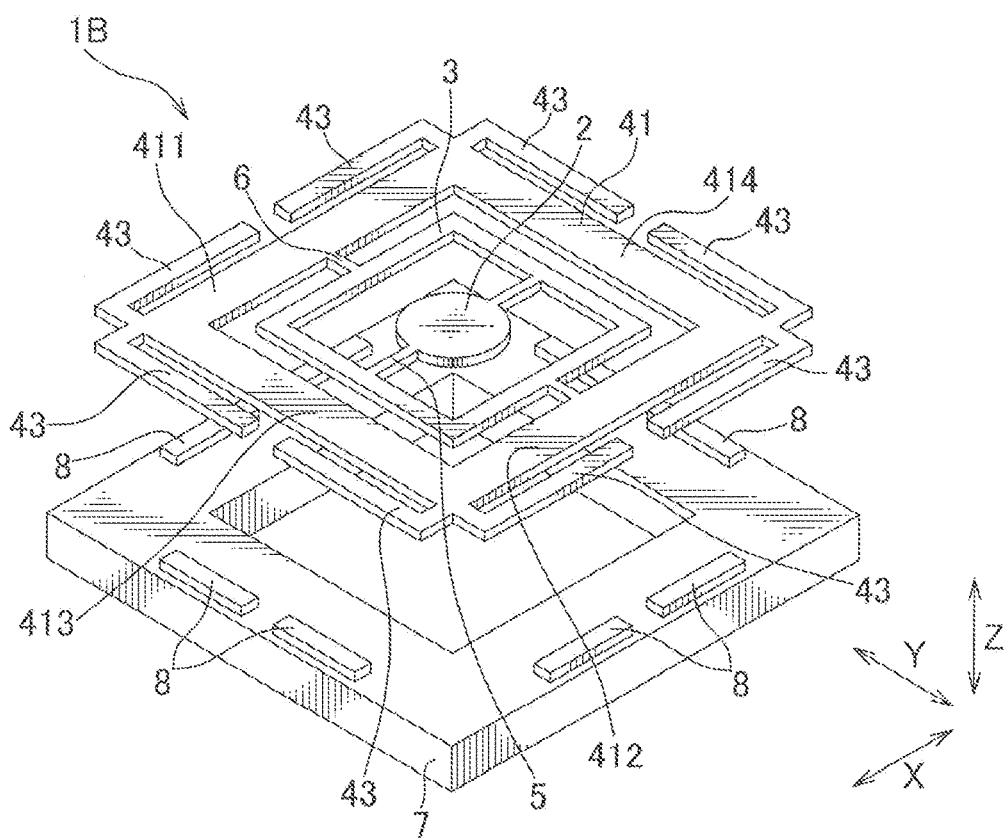
FIG. 6 is an exploded perspective view showing the driving device.
Figure 7:
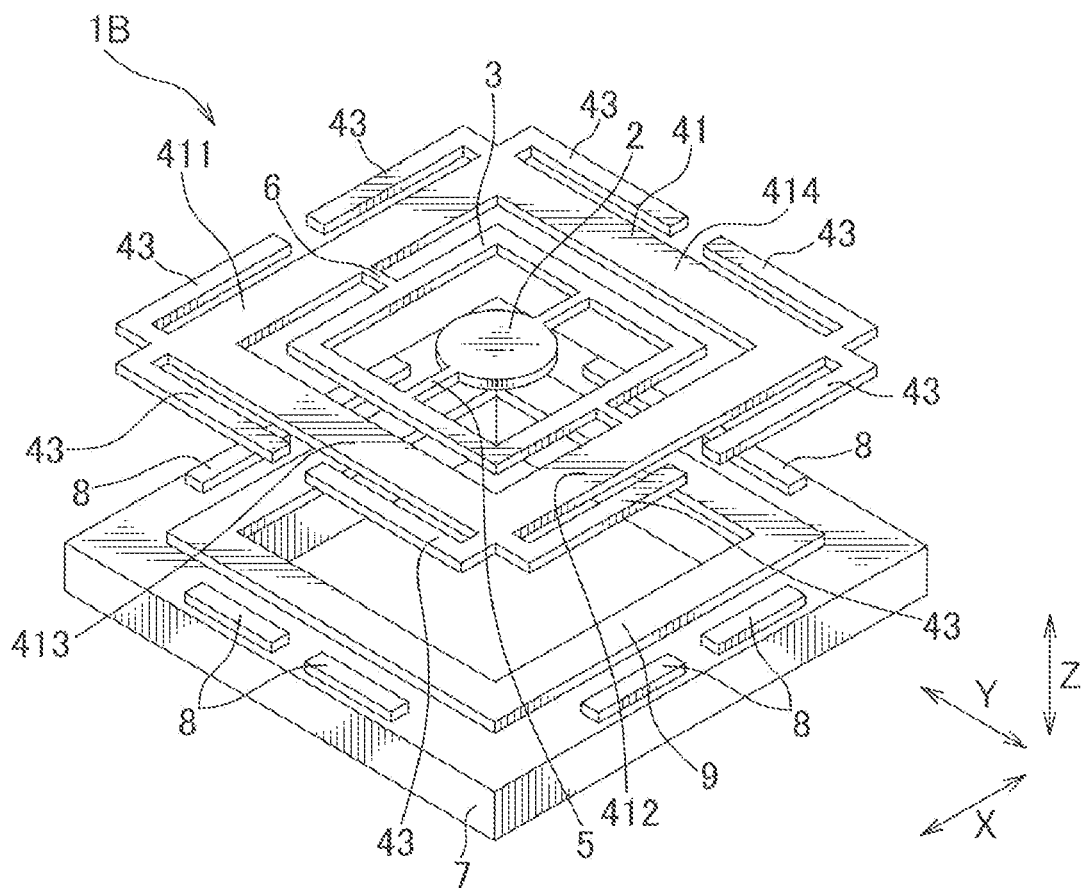
FIG. 7 is an exploded perspective view showing the driving device provided with a support member.
Figure 8:
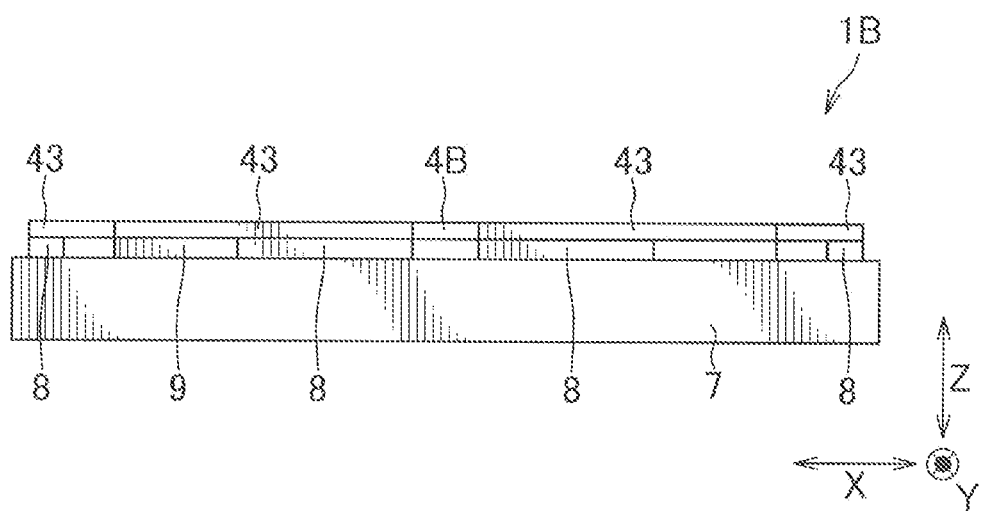
FIG. 8 is a side view showing the driving device.

As shown in FIGS. 5 to 8, a driving device 1B of this example is an optical deflector including a mirror 2, an intermediate frame 3, a base member 4B, an inner torsion bar 5, an outer torsion bar 6, a pedestal 7 and a driving section. That is, in the driving device 1B, the base member 4 of the driving device 1A of the first example is replaced with the base member 4B.

The base member 4B includes a frame-shaped part 41 and eight elastic structural parts 43. The elastic structural parts 43 extend from four corners of the frame-shaped part 41. The elastic structural part 43 includes an orthogonal part 431 extending so as to be orthogonal to the frame-shaped part 41, and a parallel part 432 extending along each side of the frame-shaped part 41. That is, the elastic structural parts 43 protruding from the corners at both ends of the first side part 411 of the frame-shaped part 41 include the orthogonal parts 431 extending along the Y direction and the parallel parts 432 extending along the X direction on an outer side of the first side part 411. The same applies to the elastic structural parts 43 protruding from the corners at both ends of each of the second to fourth side parts 412 to 414. The elastic structural parts 43 may extend from the side part of the frame-shaped part 41 at positions distant from the outer torsion bars 6, or may extend from the three corners of the frame-shaped part 41. By arranging the elastic structural parts 43 to extend from the frame-shaped part 41 at the positions distant from the outer torsion bars 6, the stress that is applied to the frame-shaped part 41 due to the difference in amount of thermal deformation generated on the base member 4 and the pedestal 7, can be prevented from being transmitted to the proximal parts of the outer torsion bars G.

The joining members 8 are provided corresponding to the distal end parts 432A of the parallel parts 432. That is, the distal end part 432A is a joined part to be joined to the pedestal 7, and the proximal end part 432B corresponding to the position where the joining member 8 is not provided is a non-joined part that is not joined to the pedestal 7. The proximal end part 432B is continuous with the frame-shaped part 41, and the distal end part 432A is continuous with the proximal end part 432B. Further, the frame-shaped part 41 is not joined to the pedestal 7 (i.e., the frame-shaped part 41 does not include the joined part).

Similar to the first example, when fixing the base member 4B to the pedestal 7, it is preferable to provide the support member 9 for positioning the base member 4B and the pedestal 7 in the Z direction.

According to above-described configuration, as in a case of the first example, with the elastic structural parts 43 of the base member 4B joined to the pedestal 7, the difference in amount of thermal deformation generated on the base member 4B and the pedestal 7 can be absorbed by the deformation of the elastic structural parts 43, thereby preventing the damage to the base member 4B and to the joined part between the base member 4B and the pedestal 7.

Further, since the elastic structural part 43 includes the parallel part 432, the base member 4B is prevented from increasing in size even when the size of the parallel part 432 is increased along each side part of the frame-shaped part 41, thereby facilitating the absorption of the difference in amount of thermal deformation.

The present invention is not limited to the examples described above, but includes other configurations and the like that can achieve the object of the present invention, and the following modifications and the like are also included in the present invention.

For example, in the first example and the second example, the elastic structural part includes an orthogonal part; however, the elastic structural part may include a part extending so as to intersect the frame-shaped part diagonally. In a case where the frame-shaped part has a circular ring-like shape, the orthogonal part may be a part of the elastic structural part that is orthogonal to a tangent line of the circle, for example.

Further, in the first example and the second example, the frame-shaped part 41 does not include the joined part with respect to the pedestal 7; however, a part of the frame-shaped part may be joined to the pedestal. For example, one side of the frame-shaped part may be joined to the pedestal, and an opposing side of the frame-shaped part may not include the joined part but may be provided with the elastic structural part.

Further, in the first example and the second example, the joining members 8 are disposed at the plurality of positions so as to correspond to each of the plurality of elastic structural parts; however, a joining member having a continuous shape may be provided. For example, a joining member with a ring-like shape may be provided depending on the position at which the elastic structural parts are disposed.

Further, in the first example and the second example, the elastic structural part includes the joined part and the non-joined part; however, the entire elastic structural part may be the joined part (i.e., the elastic structural part may not include the non-joined part), if the elastic structural part has a sufficient thickness, or if the deformation of the elastic structural part is less likely to be hindered by the joining member, or if the elastic structural part is easily deformable.

Further, in the first example and the second example, the mirror 2, the intermediate frame 3 and the inner torsion bars 5 constitute the movable part, and the movable part is rotatably supported by the base member 4 via the outer torsion bars 6 as the shaft part; however, the mirror may be the movable part and the mirror may be rotatably supported by the base member via the shaft part.

Although the preferred configurations and methods and such for carrying out the present invention have been described above, the present invention is not limited to these. That is, although the present invention is mainly illustrated and described with respect to specific examples, those skilled in the art can make modifications to the above-described examples regarding the shape, materials, quantities and other detailed configurations without departing from the scope of the technical idea and purpose of the present invention. Therefore, since the description limiting the shape, material, etc. disclosed above is merely an example for facilitating the understanding of the present invention and does not limit the present invention, the description of name of a member without a part or all of the limitation of the shape, materials, etc., is within the present invention.

REFERENCE SIGNS LIST 1A, 1B driving device
4, 4B base member
41 frame-shaped part
42, 43 elastic structural part
422 distal end part (joined part)
423 proximal end part (non-joined part)
431 orthogonal part
432 parallel part
7 pedestal
8 joining member

The invention claimed is:
1. A driving device comprising:
a movable part;
a base member that includes a frame-shaped part and that rotatably supports the movable part via a shaft part provided on an inner circumference side of the frame-shaped part;
a driving section configured to drive the movable part; and
a pedestal to which the base member is fixed, wherein
the base member includes an elastic structural part extending on an outer circumference side of the frame-shaped part, and
the elastic structural part is joined to the pedestal.

2. The driving device as claimed in claim 1, wherein the elastic structural part includes an orthogonal part that extends so as to be orthogonal to the frame-shaped part.

3. The driving device as claimed in claim 1, wherein the elastic structural part includes a parallel part that extends along the frame-shaped part.

4. The driving device as claimed in one of claim 1, wherein the frame-shaped part is not joined to the pedestal.

5. The driving device as claimed in one of claim 1, wherein the elastic structural part comprises a plurality of elastic structural parts, and
wherein joining members that join the plurality of elastic structural parts to the pedestal are disposed at a plurality of positions such that each of the joining members corresponds to a corresponding one of the plurality of elastic structural parts.

6. The driving device as claimed in one of claim 1, wherein the elastic structural part includes
a non-joined part that is continuous with the frame-shaped part and that is not joined to the pedestal, and
a joined part that is continuous with the non-joined part and that is joined to the pedestal.

* * * * *